(12) United States Patent
Itoh

(10) Patent No.: US 8,533,634 B2
(45) Date of Patent: Sep. 10, 2013

(54) EXPOSURE MASK MANUFACTURING METHOD, DRAWING APPARATUS, SEMICONDUCTOR DEVICE MANUFACTURING METHOD, AND MASK BLANKS PRODUCT

(75) Inventor: Masamitsu Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 433 days.

(21) Appl. No.: 12/659,396

(22) Filed: Mar. 8, 2010

(65) Prior Publication Data
US 2010/0228379 A1    Sep. 9, 2010

Related U.S. Application Data

(62) Division of application No. 11/185,945, filed on Jul. 21, 2005, now Pat. No. 7,703,066.

(30) Foreign Application Priority Data

Jul. 27, 2004   (JP) ................. 2004-219178

(51) Int. Cl.
*G06F 17/50* (2006.01)
*G03F 1/00* (2012.01)
*H01L 21/00* (2006.01)
*H01L 21/20* (2006.01)
*H01L 21/311* (2006.01)

(52) U.S. Cl.
USPC .............. 716/50; 716/51; 716/52; 716/53; 716/54; 716/55; 430/5; 438/48; 438/584; 438/694

(58) Field of Classification Search
USPC ............. 716/50–55; 430/5; 438/48, 584, 438/694
See application file for complete search history.

(56) References Cited

U.S. PATENT DOCUMENTS 6,537,844 B1   3/2003   Itoh
6,710,847 B1 *   3/2004   Irie ............................. 355/53

(Continued)

FOREIGN PATENT DOCUMENTS

JP   62-159425   7/1987
JP   2003-050458   2/2003

(Continued)

OTHER PUBLICATIONS

Official Action from the German Patent and Trademark Office, mailed Jul. 1, 2008, in German Patent Application No. 10 2005 035 144.1-51, and English translation thereof.

(Continued)

*Primary Examiner* — Helen Rossoshek
(74) *Attorney, Agent, or Firm* — Finnegan, Henderson, Farabow, Garrett & Dunner, LLP

(57) ABSTRACT

A method of manufacturing an exposure mask includes generating or preparing flatness variation data relating to a mask blanks substrate to be processed into an exposure mask, the flatness variation data being data relating to change of flatness of the mask blank substrate caused when the mask blank substrate is chucked by a chuck unit of an exposure apparatus, generating position correction, data of a pattern to be drawn on the mask blanks substrate based on the flatness variation data such that a mask pattern of the exposure mask comes to a predetermined position in a state that the exposure mask is chucked by the chuck unit, and drawing a pattern on the mask blanks substrate, the drawing the pattern including drawing the pattern with correcting a drawing position of the pattern and inputting drawing data corresponding to the pattern and the position correction data into a drawing apparatus.

13 Claims, 13 Drawing Sheets

(56) References Cited

U.S. PATENT DOCUMENTS

| | | |
|---|---|---|
| 6,727,565 B2 | 4/2004 | Itoh |
| 7,060,519 B2 | 6/2006 | Itoh |
| 7,155,689 B2 | 12/2006 | Pierrat et al. |
| 7,344,808 B2 | 3/2008 | Numanami et al. |
| 7,351,504 B2 | 4/2008 | Nakatsu et al. |
| 7,384,713 B2 | 6/2008 | Itoh |
| 7,435,609 B2 | 10/2008 | Itoh |
| 7,444,616 B2 | 10/2008 | Sandstrom et al. |
| 7,456,031 B2 * | 11/2008 | Omori et al. .............. 438/14 |
| 7,474,386 B2 | 1/2009 | Fujisawa et al. |
| 7,479,365 B2 | 1/2009 | Itoh |
| 7,713,663 B2 * | 5/2010 | Okubo et al. ............. 430/5 |
| 7,906,256 B2 * | 3/2011 | Ueda et al. ............... 430/5 |
| 8,193,100 B2 * | 6/2012 | Itoh ......................... 438/736 |
| 2003/0153114 A1 | 8/2003 | Itoh |
| 2004/0072082 A1 | 4/2004 | Ito et al. |
| 2004/0081898 A1 | 4/2004 | Kamm et al. |
| 2004/0146789 A1 | 7/2004 | Itoh |
| 2004/0253524 A1 | 12/2004 | Itoh |
| 2005/0019676 A1 | 1/2005 | Nakatsu et al. |
| 2005/0019677 A1 | 1/2005 | Nakatsu et al. |
| 2005/0214657 A1 * | 9/2005 | Mitsui ....................... 430/5 |
| 2005/0240895 A1 | 10/2005 | Smith et al. |
| 2007/0063453 A1 | 3/2007 | Ishikawa et al. |
| 2009/0227112 A1 | 9/2009 | Itoh |

FOREIGN PATENT DOCUMENTS

| | | |
|---|---|---|
| JP | 2005274953 A * | 10/2005 |
| WO | WO 00/72090 A2 | 11/2000 |

OTHER PUBLICATIONS

Notification of Reasons for Rejection mailed Oct. 27, 2009, in corresponding Japanese Patent Application No. 2004-219178, and English-language translation thereof.

Goodall et al., "Effects and Interactions of Wafer Shape and Stpper Chucks on Wafer Flatness Control," Oct. 18-19, 1993, Advanced Semiconductor Manufacturing Conference and Workshop, 1993, ASMC 93 Proceedings, IEEE/SEMI, pp. 118-123.

* cited by examiner

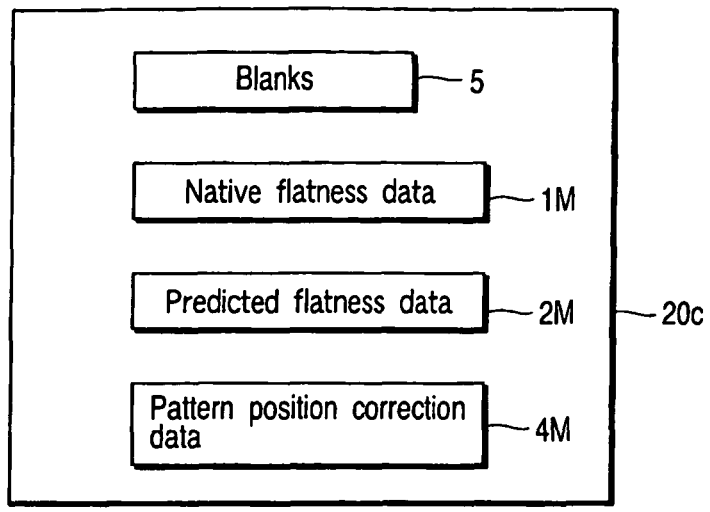
F I G. 13
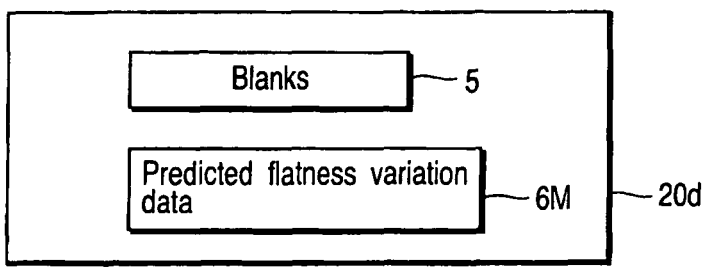
F I G. 14
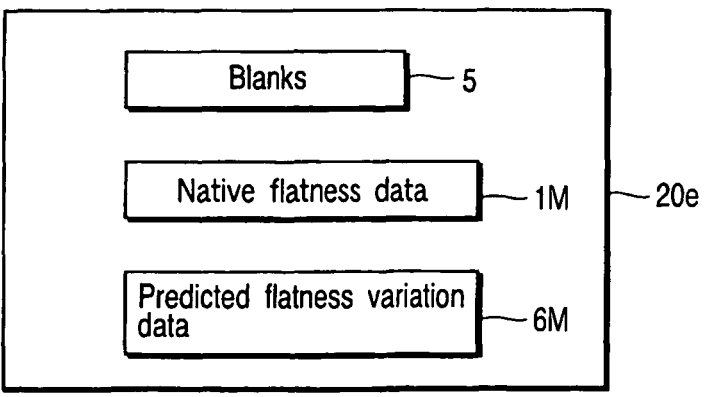
F I G. 15

EXPOSURE MASK MANUFACTURING METHOD, DRAWING APPARATUS, SEMICONDUCTOR DEVICE MANUFACTURING METHOD, AND MASK BLANKS PRODUCT

CROSS-REFERENCE TO RELATED APPLICATIONS

This application is a division of U.S. application Ser. No. 11/185,945, filed Jul. 21, 2005, now U.S. Pat. No. 7,703,066, which is based upon and claims the benefit of priority from prior Japanese Patent Application No. 2004-219178, filed Jul. 27, 2004. The entire contents of these applications are incorporated herein by reference in their entirety.

BACKGROUND OF THE INVENTION

1. Field of the Invention

The present invention relates to an exposure mask manufacturing method, an drawing apparatus, a semiconductor device manufacturing method, and a mask blanks product in a semiconductor field.

2. Description of the Related Art

As semiconductor devices become smaller, there is an increasing demand for miniaturization in a photolithography process. Already, the device design rule is as small as 65 nm. Accordingly, the pattern dimension precision is required to be controlled very strictly at 5 nm or less.

In a semiconductor manufacturing process, a multilayer pattern is formed by using plural photo masks. At this time, an alignment precision between upper and lower patterns is also very strict, same as in pattern dimension precision, in the trend of the finer design rule.

In this background, hindering factors of high precision in a pattern forming process include deformation such as distortion of photo masks occurring when the photo masks for use in the photolithography process is chucked in the exposure apparatus.

Recently, to achieve a desired flatness, a photo mask has been developed, which guarantees a desired flatness in a state that the photo mask is chucked in the exposure apparatus by predicting in advance flatness of the mask after chucking of the photo mask (Jpn. Pat. Appln. KOKAI Publication No. 2003-050458). The mask flatness is extremely excellent in a state that the photo mask is chucked in the exposure apparatus.

However, there are many cases in which precision of a mask pattern position becomes problematic. The reasons are considered as follows.

A photo mask manufacturing process includes a process of drawing a mask pattern on a mask blanks substrate by using a mask drawing apparatus. The mask drawing apparatus holds the mask blanks substrate so as not to distort the mask blanks substrate as much as possible. For example, the mask blanks substrate is held at three points. Thus, the mask pattern is drawn in a state that native flatness of the mask blanks substrate is maintained.

A wafer pattern manufacturing process includes a process of transferring a mask pattern on a wafer by using a wafer exposure apparatus. The wafer exposure apparatus chucks a photo mask by using a chucking mechanism such as a vacuum chucking mechanism. By using such a chucking mechanism, however, the photo mask is deformed.

Therefore, as shown in FIG. 18, a position of a pattern 92 is deviated by δ between the case where a photo mask 91 is not deformed (before chucking) and the case where the photo mask is deformed (after chucking). When deformed like warp as shown in FIG. 18 (warp is schematically indicated by inclined straight line) is arised, the position of the pattern 92 is deviated to right side. Meanwhile, when the photo mask in the Jpn. Pat. Appln. KOKAI Publication is used, the flatness of the photo mask after chucking is improved.

Whether the photo mask in the Jpn. Pat. Appln. KOKAI Publication is used or not, chucking the photo mask causes the deformation in the photo mask, and thus, the mask pattern cannot be correctly transferred onto the wafer precisely as the pattern position before chucking.

So far, position deviation of a mask pattern due to deformation of a photo mask was not a serious problem. However, since the pattern dimension precision is required to be very strict, 5 nm or less, at the present, such a problem cannot be ignored.

BRIEF SUMMARY OF THE INVENTION

According to an aspect of the present invention, there is provided a method of manufacturing an exposure mask comprising: generating or preparing flatness variation data relating to a mask blanks substrate to be processed into an exposure mask, the flatness variation data being data relating to change of flatness of the mask blank substrate caused when the mask blank substrate is chucked by a chuck unit of an exposure apparatus; generating position correction data of a pattern to be drawn on the mask blanks substrate based on the flatness variation data such that a mask pattern of the exposure mask comes to a predetermined position in a state that the exposure mask is chucked by the chuck unit; and drawing a pattern on the mask blanks substrate, the drawing the pattern including drawing the pattern with correcting a drawing position of the pattern and inputting drawing data corresponding to the pattern and the position correction data into a drawing apparatus.

According to an aspect of the present invention, there is provided a drawing apparatus comprising: a position correction data generating unit configured to generate position correction data of a pattern to be drawn on a mask blanks substrate to be processed into an exposure mask, the position correction data being data for bringing a pattern of the exposure mask in a state chucked by a chuck unit of an exposure apparatus into a predetermined position; and a drawing unit configured to draw the pattern on the mask blanks substrate with correcting a drawing position of the pattern based on the drawing data corresponding to the pattern and the position correction data.

According to an aspect of the present invention, there is provided a method of manufacturing a semiconductor device comprising: applying a resist on a substrate including a semiconductor substrate; disposing an exposure mask manufactured by the exposure mask manufacturing method according to any one of claims 1, 2 and 3 above the substrate in an exposure apparatus, irradiating charged beam or light onto the resist by way of the exposure mask in a state that the exposure mask is chucked by a chuck unit of the exposure apparatus, and forming a first resist pattern by developing the resist after the irradiating the charged beam or the light onto the resist; and forming a first pattern by etching the substrate using the first resist pattern as a mask.

According to an aspect of the present invention, there is provided a mask blanks product comprising: a mask blanks substrate to be processed into an exposure mask including a mask pattern; and a recording medium in which position correction data of a pattern to be drawn on the mask blanks substrate is recorded, the position correction data being data for bringing the mask pattern of the exposure mask in a state chucked by a chuck unit of an exposure apparatus into a predetermined position.

According to an aspect of the present invention, there is provided a mask blanks product comprising: a mask blanks substrate to be processed into an exposure mask including a mask pattern; and a recording medium in which predicted flatness variation data is recorded, the predicted flatness variation data being data for predicting flatness variation of the exposure mask caused when the exposure mask is chucked by a chuck unit of an exposure apparatus.

BRIEF DESCRIPTION OF THE SEVERAL VIEWS OF THE DRAWING

FIG. 13 is a diagram schematically showing a mask blanks product according to the tenth embodiment of the invention;

FIG. 14 is a diagram schematically showing a mask blanks product according to the eleventh embodiment of the invention;

FIG. 15 is a diagram schematically showing a mask blanks product according to the twelfth embodiment of the invention;

DETAILED DESCRIPTION OF THE INVENTION

Now, embodiments of the invention will be described below with reference to the accompanying drawings.

First Embodiment

Figure 1:
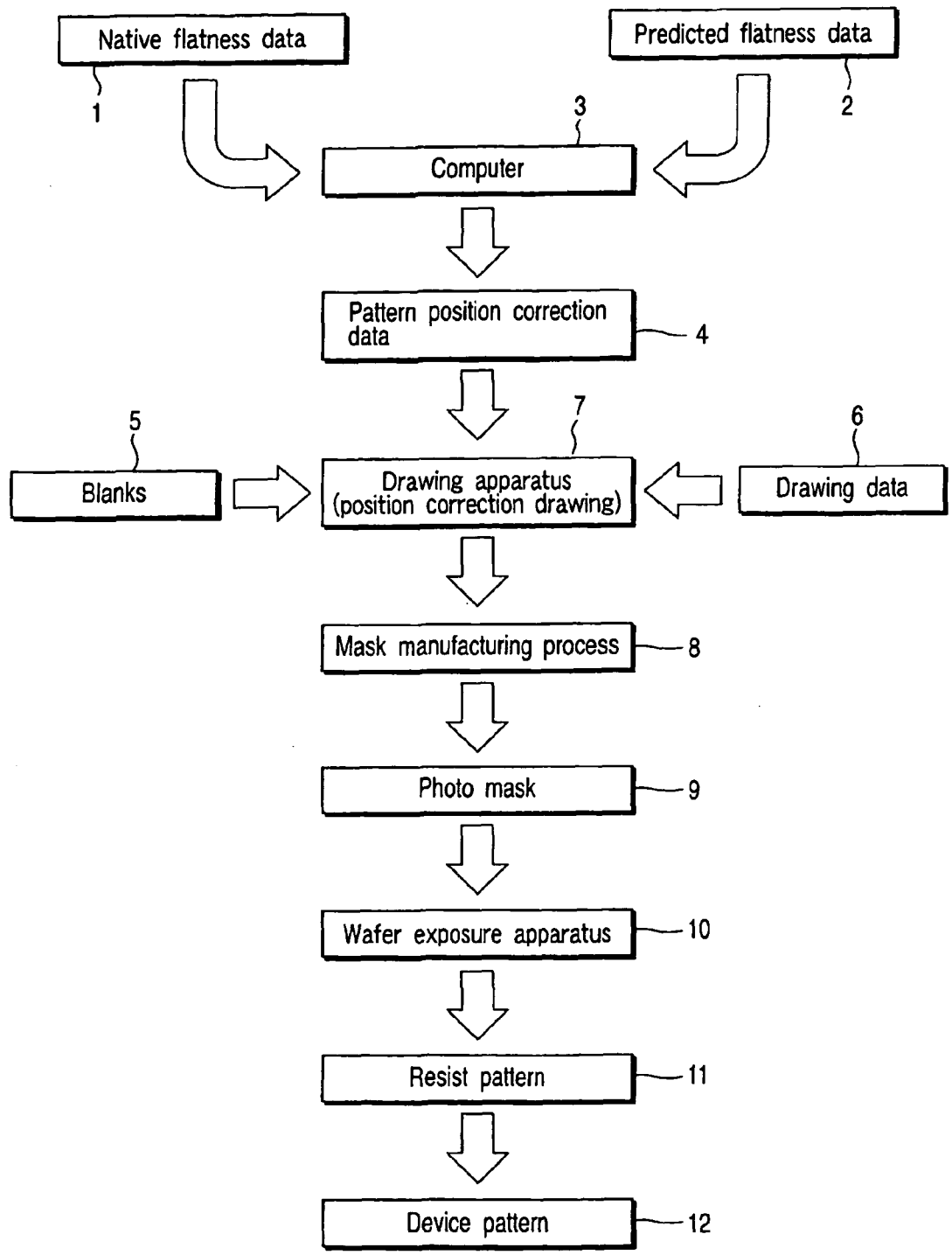
FIG. 1 is a flowchart from a photo mask manufacturing process to a semiconductor device manufacturing process according to the first embodiment of the invention.

FIG. 1 is a flowchart from a photo mask manufacturing process to a semiconductor device manufacturing process according to the first embodiment of the invention.

The present embodiment is different from a prior art in that, when forming a pattern on a mask blanks substrate 5 by using a drawing apparatus 7, data not used hitherto, that is, pattern position correction data 4 is used in addition to drawing data 6 hitherto used as data to be input to the drawing apparatus 7. The present embodiment will be described below.

First, a mask blanks product is purchased from a mask blanks manufacturer. The product comprises a mask blanks substrate 5 processed into a photo mask (exposure mask); flatness measurement data (native flatness data) 1 of the mask blanks substrate 5 in a state not chucked by a chuck unit (for example, a vacuum chuck) in a wafer exposure apparatus 10; and flatness prediction data (predicted flatness data) 2 of the mask blanks substrate 5 in a state chucked by the chuck unit.

The mask blanks substrate 5 comprises a quartz substrate (transparent substrate) of 6 inches square (152 mm square) and about 6 mm in thickness, an ArF halftone film provided on the quartz substrate, a Cr film provided on the ArF halftone film, and a chemically amplified resist FEP-171 of 300 nm in thickness provided on the Cr film.

The native flatness data is acquired by measuring flatness of the mask blanks substrate 5 by use of, for example, UltraFlat of Tropel. Herein, the native flatness data is mask flatness data of 1 mm grid in a region of 150 mm square.

Next, the native flatness data 1 and predicted flatness data 2 are input into a computer 3.

The computer 3 generates correction data (pattern position correction data) 4 necessary for correcting a position of a pattern (mask pattern) on a photo mask to be a desired position in a sate that the mask blanks substrate 5 is chucked in the wafer exposure apparatus 10 based on the native flatness data 1 and predicted flatness data 2.

Figure 18:
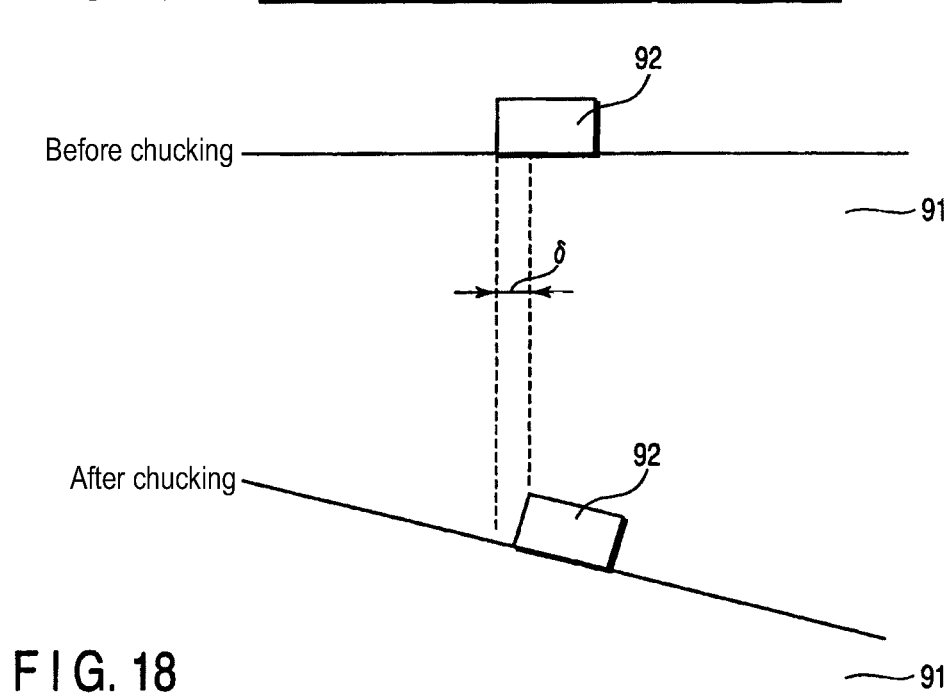
FIG. 18 is a diagram for explaining problems of a prior art.

For example, when the positional deviation of the pattern before and after chucking the photo mask in the wafer exposure apparatus 10 is δ as shown in FIG. 18, it is intended to generate data instructing the position of the mask blanks substrate 5 to be deviated by δ to the right side relatively with respect to drawing beam when drawing the pattern.

In order that all patterns on the photo mask after chucking come to desired positions, a process of generating the pattern position correction data 4 is, for example, as follows.

That is, the process of generating the pattern position correction data 4 includes; a process of calculating data (mask flatness variation data) relating to change of flatness of the mask blanks substrate 5 before and after chucking in the wafer exposure apparatus 10 based on the native flatness data 1 and predicted flatness data 2; a process of generating a position distortion map (a mask pattern position distortion map, 150 mm square) of the pattern on the mask blanks substrate 5 caused by change of the flatness based on the mask flatness variation data; and a process of calculating a variation amount map (=pattern position correction data 4) of the position (mask pattern position) of the mask blanks substrate 5 necessary for the mask pattern to coincide with desired position based on the mask pattern position distortion map.

The pattern position correction data 4 is given, for example, by X-Y stage position coordinates (X-Y coordinates) for mounting the mask blanks substrate 5 and moving the mask blanks substrate 5 in the X-Y direction.

Next, the mask blanks substrate 5 is set in the drawing apparatus (for example, an electron beam drawing apparatus EBM4000) 7. The pattern position correction data 4 and drawing data 6 are input to the drawing apparatus 7.

Next, a mask manufacturing process 8 including the drawing process using the drawing apparatus 7 is carried out. That is, the drawing apparatus 7 draws a pattern corresponding to the drawing data 6 on the mask blanks substrate 5 with correcting the relative positions of the mask blanks substrate 5 and electron beam, such that the mask pattern of the photo mask in a state chucked in the exposure apparatus 10 coincides with the desired position based on the pattern position correction data 4. Thereafter, a resist pattern is formed by ordinary post exposure bake (PEB) and developing process. And using this resist pattern as a mask, the Cr film and halftone film are etched by an etching apparatus (for example, UNAXIS-G4). In this manner, a mask substrate comprising a quartz substrate, patterns of the Cr film and halftone film formed on the quartz substrate 5 is formed.

Next, the resist pattern is removed, defect inspection and defect repair for the mask substrate are carried out, thereafter, a pellicle is attached to the mask substrate to obtain a photo mask 9.

Next, the photo mask 9 is set in the wafer exposure apparatus (for example, a wafer exposure apparatus S307 of Nikon) 10, the resist applied on the wafer is exposed, thereafter, an ordinary resist process such as developing is carried out to form a resist pattern 11.

In the wafer, a pattern of elements and wires (underlying pattern) may be already formed, or a pattern may not be formed. In the latter case, the resist pattern 11 is used for forming, for example, an isolation trench.

Next, the wafer is etched by using the resist pattern 11 as a mask, and a device pattern 12 is formed on the wafer. The device pattern 12 is a pattern of, for example, an isolation trench, a transistor, a wiring, an electrode, a contact hole, etc.

In the example, only one photo mask 9 is explained, but actually plural photo masks 9 are generated. Therefore, a plurality of laminated device patterns 12 are formed.

The in-plane distribution (64 positions in chip) of alignment error of the device pattern of the uppermost layer and its immediately lower device pattern (underlying pattern) is measured by a measuring instrument of KLA. As a result, the alignment error of 20 nm (38) existing in the case of using a conventional photo mask has been outstandingly decreased to 12 nm (38) in the case of using the photo mask of the present embodiment. Therefore, the device manufacturing yield is improved, and the semiconductor device can be supplied at lower price and shorter term than in the prior art.

Second Embodiment

Figure 2:
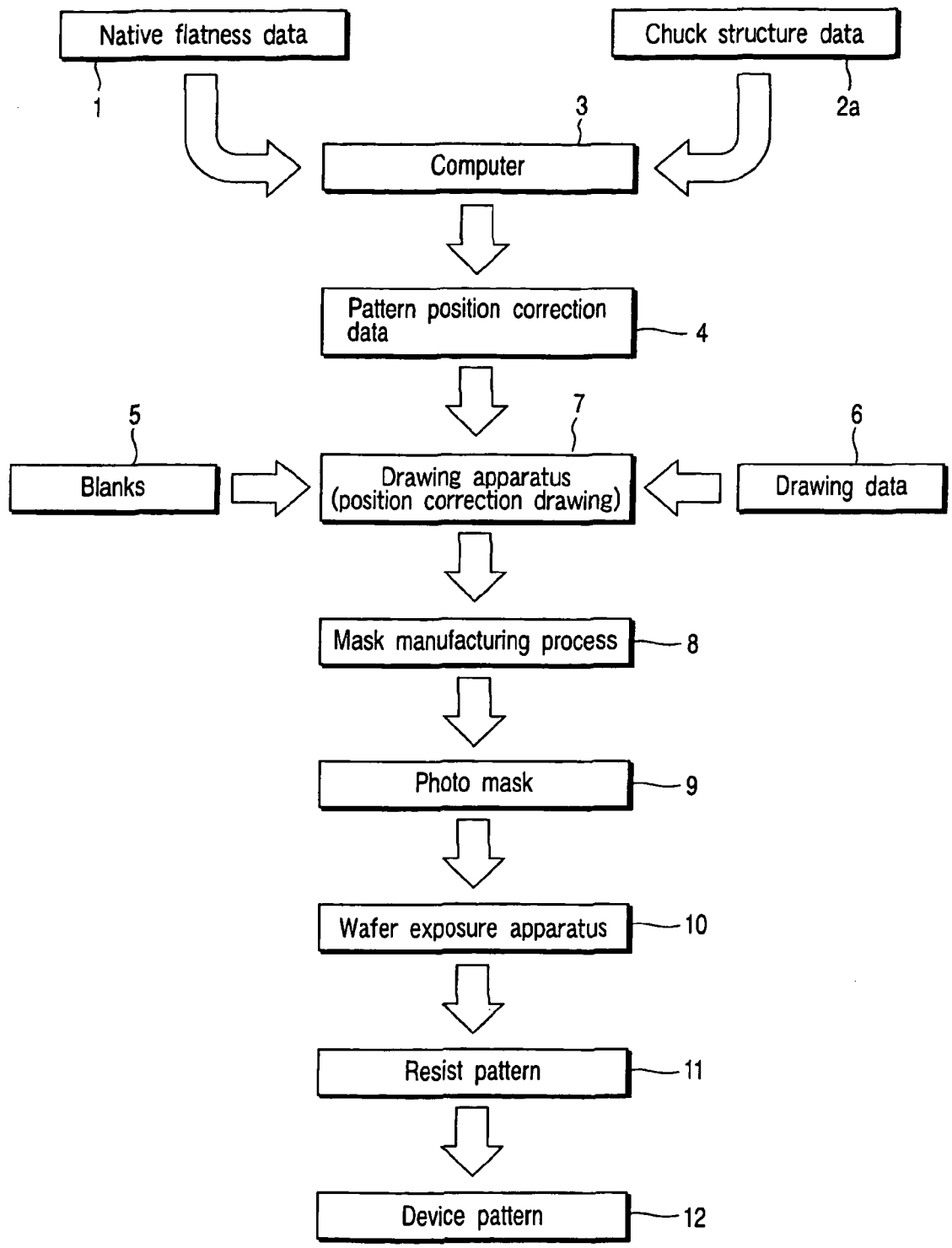
FIG. 2 is a flowchart from a photo mask manufacturing process to a semiconductor device manufacturing process according to the second embodiment of the invention.

FIG. 2 is a flowchart from a photo mask manufacturing process to a semiconductor device manufacturing process according to the second embodiment of the invention. Same parts as in FIG. 1 are identified with same reference numerals, and detailed description of configuration and effects is omitted.

In the first embodiment, explanation has been given for the case where the mask blanks product comprising the mask blanks substrate 5, native flatness data 1, and predicted flatness data 2 is purchased from a mask blanks manufacturer.

The present embodiment explains that a mask blanks product comprising the mask blanks substrate 5 and native flatness data 1 is purchased from a mask blanks manufacturer. That is, the predicted flatness data 2 is not supplied from the mask blanks manufacturer. In the present embodiment, therefore, the predicted flatness data 2 is generated by the mask manufacturer.

First, in the present embodiment, chuck structure data 2a of the exposure apparatus 10 is prepared at the mask manufacturer.

The chuck structure data 2a is data relating to a chuck unit (for example, a vacuum chuck mechanism) for chucking the mask blanks substrate 5, and it is dimensional data relating to the structure of a portion for chucking the mask blanks substrate 5 (chuck unit). More specifically, it is dimensional data of a portion having effects on deformation (distortion) of the mask blanks substrate 5, out of the chuck unit.

Figure 19A:
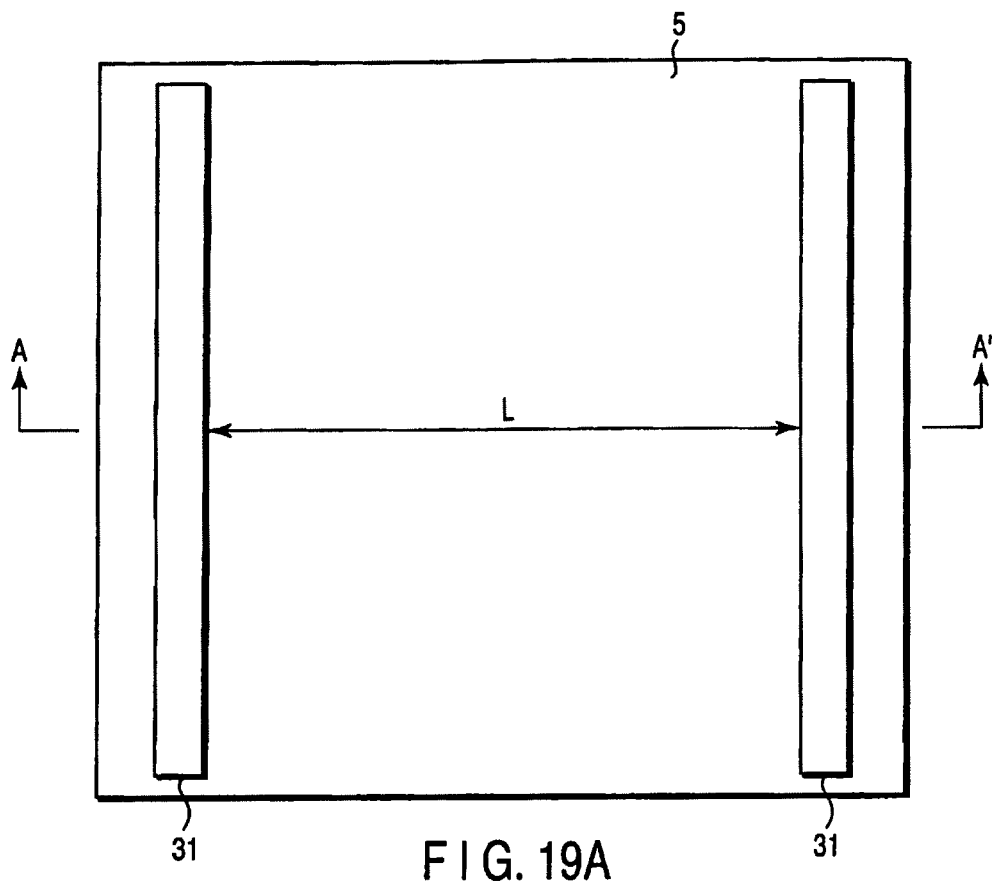
FIGS. 19A to 19C are diagrams for explaining a vacuum chucking mechanism.
Figure 19B:
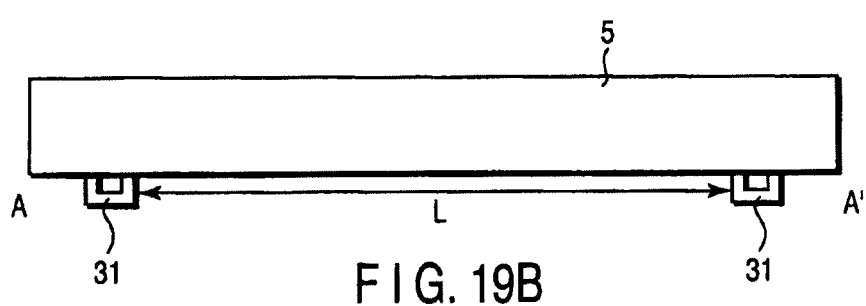
Figure 19C:
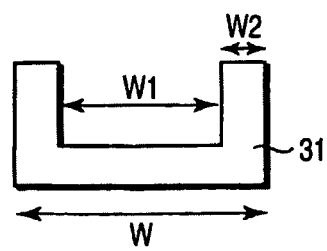

For example, in the case of the vacuum chuck mechanism, as shown in FIGS. 19A to 19C, the data relates to a distance L between two chuck units 31, a length of the chuck unit 31, a width W of the chuck unit 31, a width W1 of an opening of the chuck unit 31 (the portion not contacting with the mask blanks substrate 5), and a width W2 of the portion of the chuck unit 31 contacting with the mask blanks substrate 5.

Next, the native flatness data 1 and chuck structure data 2a are input into the computer 3. The computer 3 generates predicted flatness data in a state that the mask blanks substrate 5 is chucked in the exposure apparatus 10 based on the native flatness data 1 and chuck structure data 2a, and generates pattern position correction data 4a based on the predicted flatness data and native flatness data 1.

The subsequent process is same as in the first embodiment, and same effects as in the first embodiment are obtained.

Third Embodiment

Figure 3:
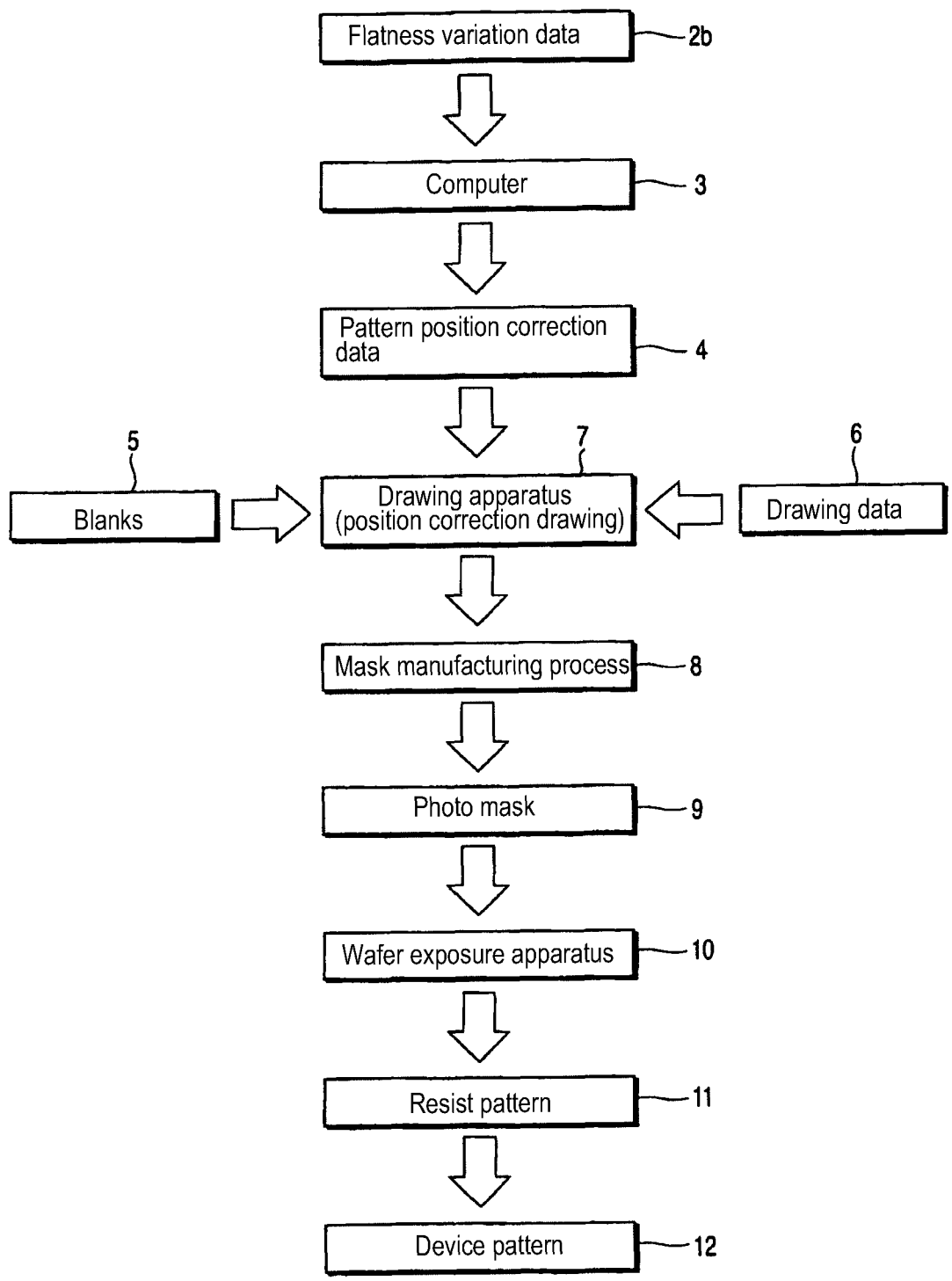
FIG. 3 is a flowchart from a photo mask manufacturing process to a semiconductor device manufacturing process according to the third embodiment of the invention.

FIG. 3 is a flowchart from a photo mask manufacturing process to a semiconductor device manufacturing process according to the third embodiment of the invention. Same parts as in FIG. 1 are identified with same reference numerals, and detailed description of configuration and effects is omitted.

The present embodiment is different from the first embodiment in that a mask blanks product comprising the mask blanks substrate 5 and mask flatness variation data 2b is purchased from a mask blanks manufacturer. A computer 3 generates pattern position correction data based on the mask flatness variation data 2b.

In the first embodiment, the mask flatness variation data is generated from the native flatness data 1 and predicted flatness data 2, but in the present embodiment, the mask flatness variation data 2b is preliminarily given from the mask blanks manufacturer, and thus, the process of generating the pattern position correction data is simplified. Besides, same effects as in the first embodiment are obtained.

Fourth Embodiment

Figure 4:
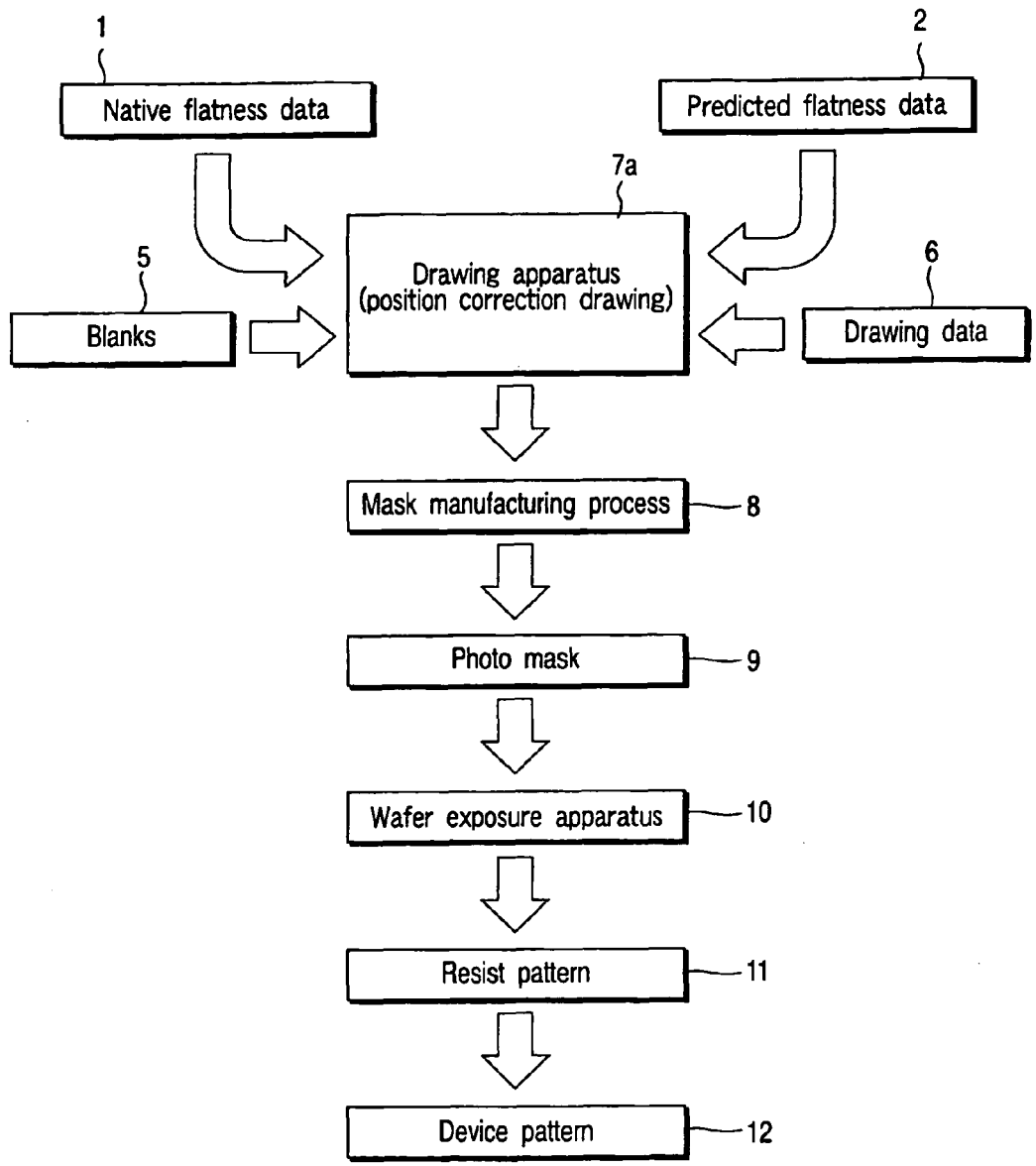
FIG. 4 is a flowchart from a photo mask manufacturing process to a semiconductor device manufacturing process according to the fourth embodiment of the invention.
Figure 5:
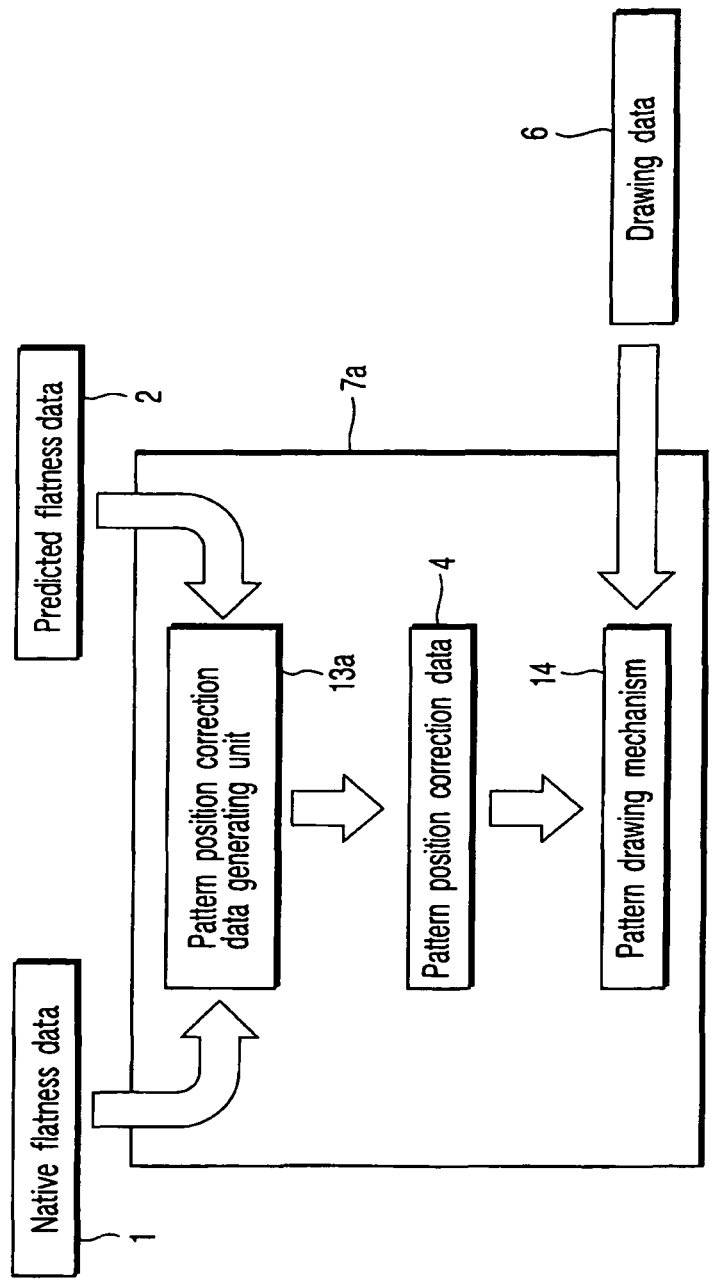
FIG. 5 is a diagram schematically showing a drawing apparatus according to the fourth embodiment.

FIG. 4 is a flowchart from a photo mask manufacturing process to a semiconductor device manufacturing process according to the fourth embodiment of the invention. FIG. 5 is a diagram schematically showing a drawing apparatus 7a of the present embodiment. Same parts as in FIG. 1 are identified with same reference numerals, and detailed description of configuration and effects is omitted.

The present embodiment is different from the first embodiment (FIG. 1) in that a drawing apparatus 7a having a mechanism for generating pattern position correction data 4 is used. That is, the drawing apparatus 7a comprises, as shown in FIG. 5, a pattern position correction data generating unit 13a for generating the pattern position correction data 4 by using the native flatness data 1 and predicted flatness data 2, and a pattern drawing mechanism 14 for drawing a pattern on the mask blanks substrate 5 with correcting the mask pattern position based on the pattern position correction data 4 and the drawing data 6.

The pattern position correction data generating unit 13*a* comprises exclusive hardware for generating the pattern position correction data 4, or a general-purpose computer (CPU), and a program for causing the computer to execute the instruction for generating pattern position correction data.

The instruction for generating the pattern position correction data includes a instruction for generating flatness variation data based on the predicted flatness data 2, and a instruction for generating pattern position correction data based on the flatness variation data and the native flatness data.

The drawing apparatus 7*a* is manufactured, for example, by a drawing apparatus manufacturer.

Also in the present embodiment, same effects as in the first embodiment are obtained.

Fifth Embodiment

Figure 6:
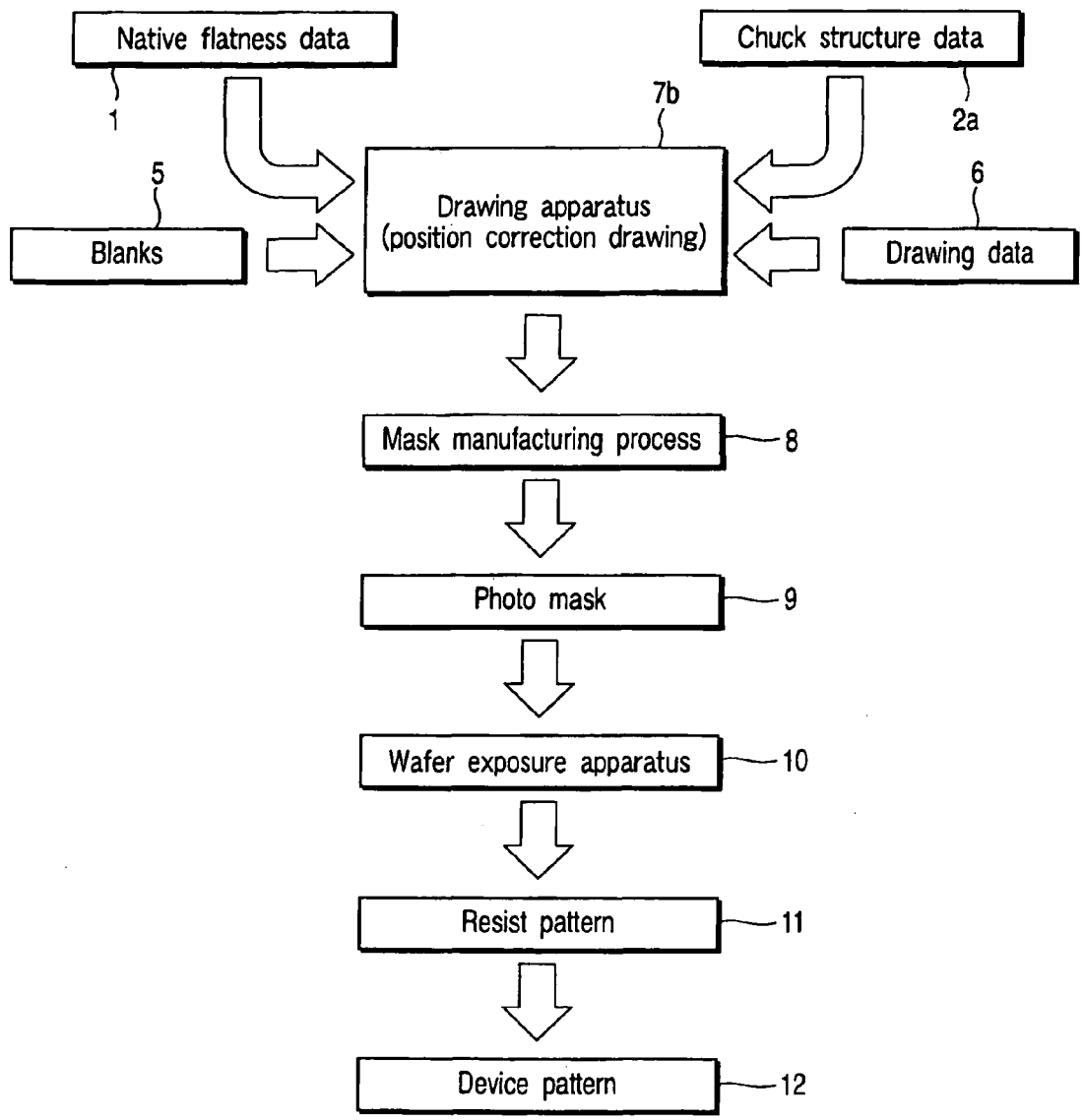
FIG. 6 is a flowchart from a photo mask manufacturing process to a semiconductor device manufacturing process according to the fifth embodiment of the invention.
Figure 7:
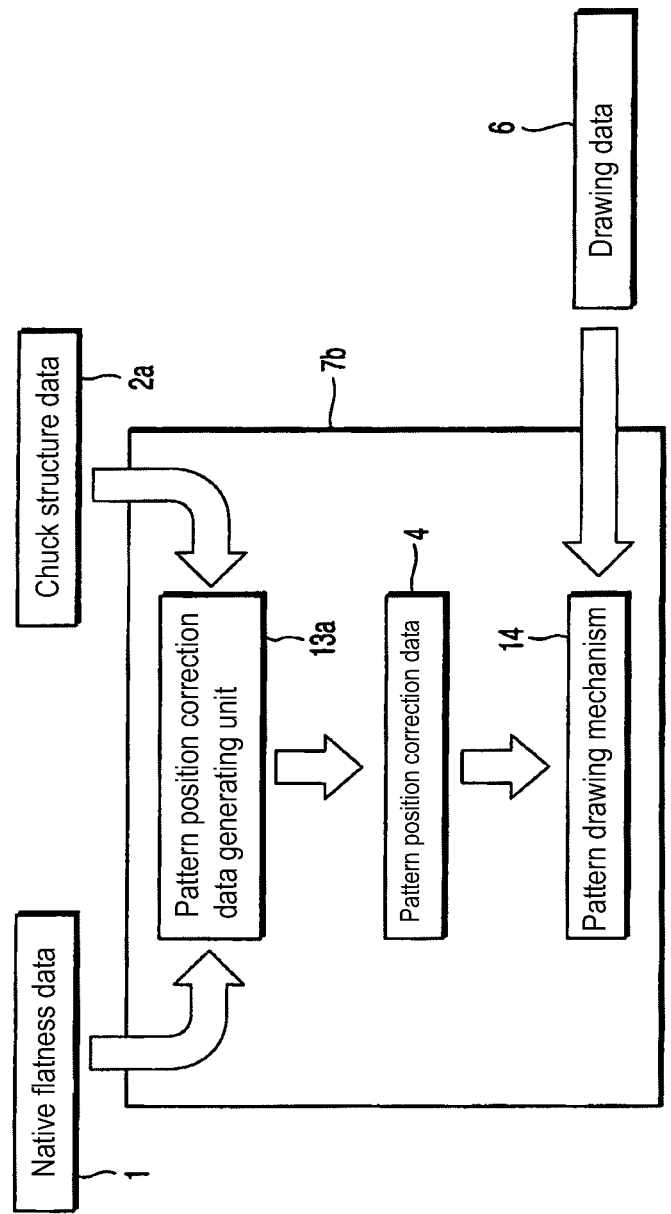
FIG. 7 is a diagram schematically showing a drawing apparatus according to the fifth embodiment.

FIG. 6 is a flowchart from a photo mask manufacturing process to a semiconductor device manufacturing process according to the fifth embodiment of the invention. FIG. 7 is a diagram schematically showing a drawing apparatus 7*b* of the present embodiment. Same parts as in FIG. 2 are identified with same reference numerals, and detailed description of configuration and effects is omitted.

The present embodiment is different from the second embodiment (FIG. 2) in that the drawing apparatus 7*b* having a mechanism for generating pattern position correction data 4 is used. That is, the drawing apparatus 7*b* comprises, as shown in FIG. 7, a pattern position correction data generating unit 13*b* for generating the pattern position correction data 4 by using the native flatness data 1 and the chuck structure data 2*a*, and a pattern drawing mechanism 14 for drawing a pattern on the mask blanks substrate 5 with correcting the mask pattern position based on the pattern position correction data 4 and the drawing data 6.

The pattern position correction data generating unit 13*b* comprises exclusive hardware for generating the pattern position correction data 4, or a general-purposed computer (CPU), and a program for causing the computer to execute the instruction for generating pattern position correction data.

The instruction for generating the pattern position correction data includes a instruction for generating predicted flatness data 2 based on the chuck structure data, a instruction for generating flatness variation data based on the predicted flatness data 2, and a instruction for generating pattern position correction data based on the flatness variation data and the native flatness data 1.

The drawing apparatus 7*b* is manufactured, for example, by a drawing apparatus manufacturer.

Also in the present embodiment, same effects as in the second embodiment are obtained.

Sixth Embodiment

Figure 8:
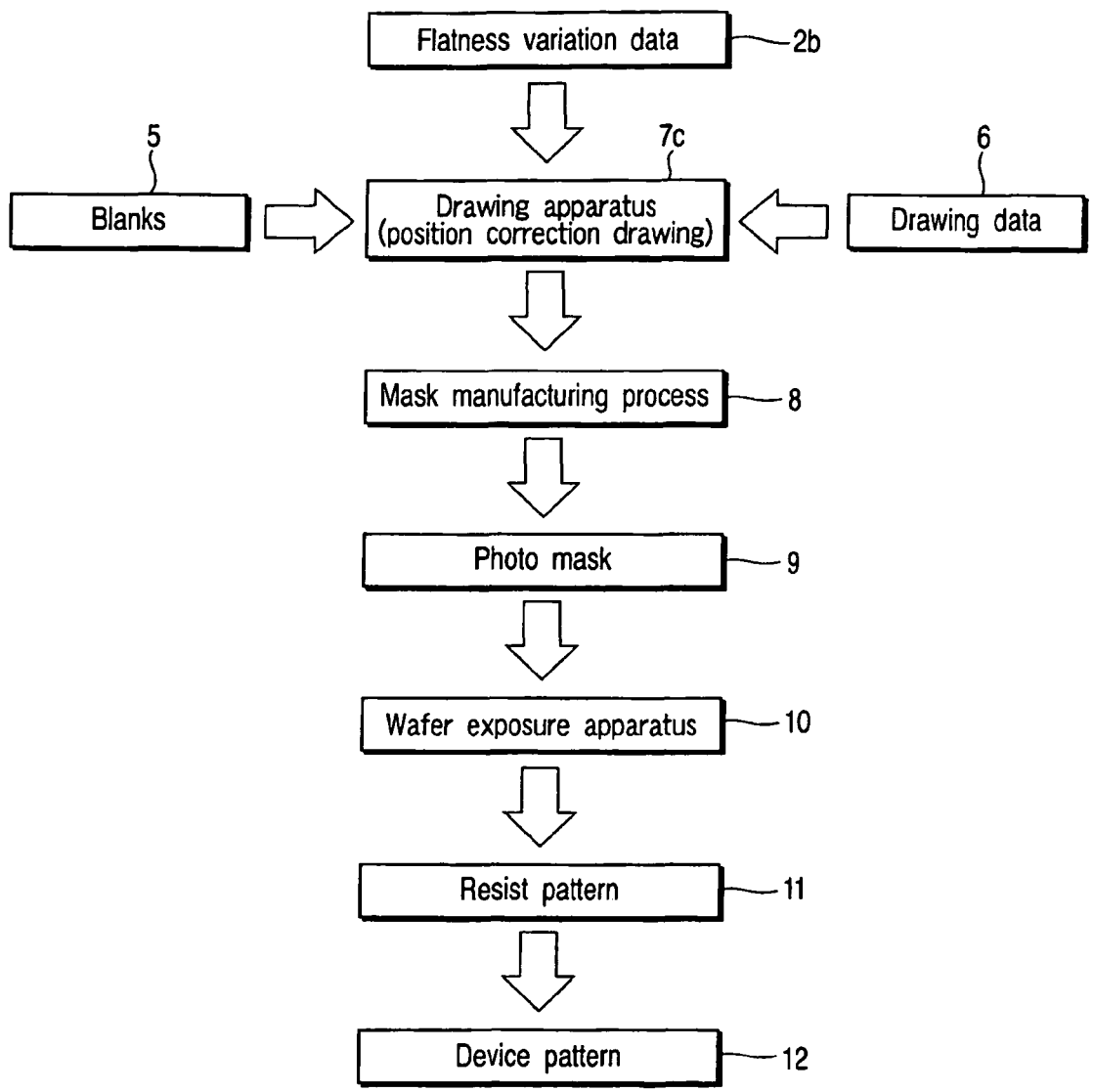
FIG. 8 is a flowchart from a photo mask manufacturing process to a semiconductor device manufacturing process according to the sixth embodiment of the invention.
Figure 9:
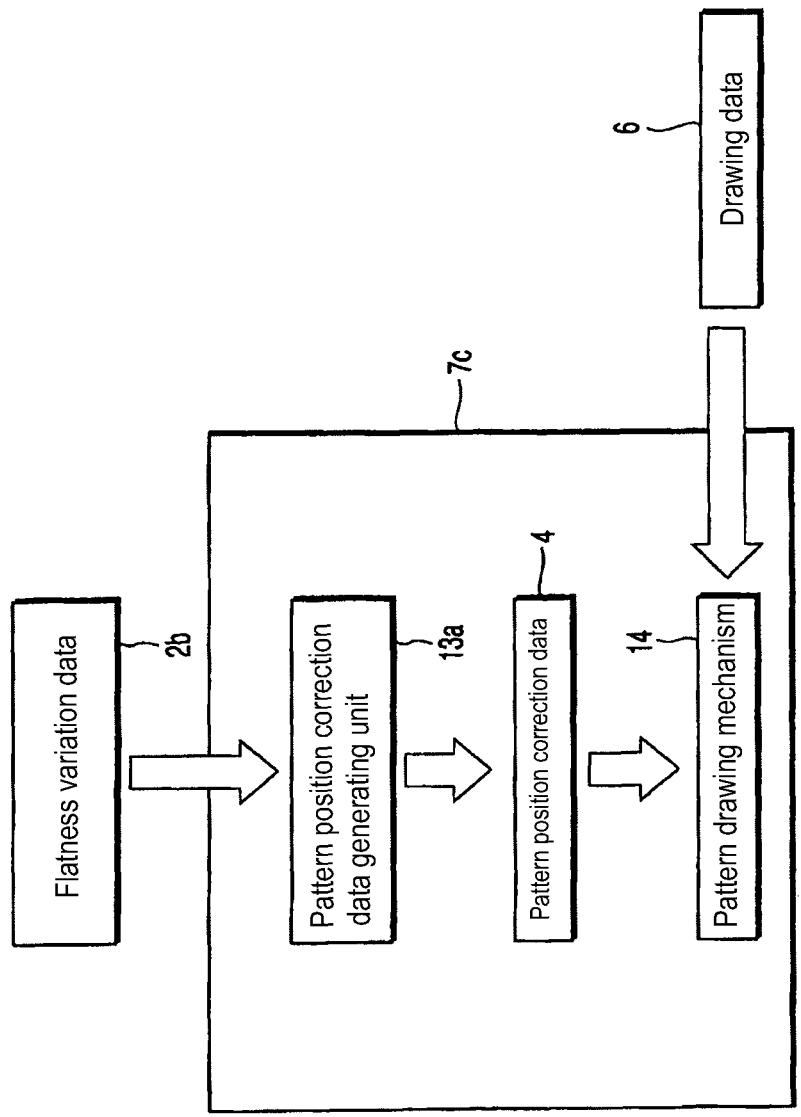
FIG. 9 is a diagram schematically showing a drawing apparatus according to the sixth embodiment.

FIG. 8 is a flowchart from a photo mask manufacturing process to a semiconductor device manufacturing process according to the sixth embodiment of the invention. FIG. 9 is a diagram schematically showing a drawing apparatus 7*c* of the present embodiment. Same parts as in FIG. 3 are identified with same reference numerals, and detailed description of configuration and effects is omitted.

The present embodiment is different from the third embodiment (FIG. 3) in that the drawing apparatus 7*c* having a mechanism for generating pattern position correction data 4 is used. That is, the drawing apparatus 7*c* comprises, as shown in FIG. 9, a pattern position correction data generating unit 13*c* for generating the pattern position correction data 4 based on the flatness variation data 2*b*, and a pattern drawing mechanism 14 for drawing a pattern on the mask blanks substrate 5 with correcting the mask pattern position based on the pattern position correction data 4 and the drawing data 6.

The pattern position correction data generating unit 13*c* comprises exclusive hardware for generating pattern position correction data, or a general-purpose computer (CPU), and a program for causing the computer to execute the instruction of generating pattern position correction data.

The drawing apparatus 7*c* is manufactured, for example, by a drawing apparatus manufacturer.

Also in the present embodiment, same effects as in the third embodiment are obtained.

Seventh Embodiment

Figure 10:
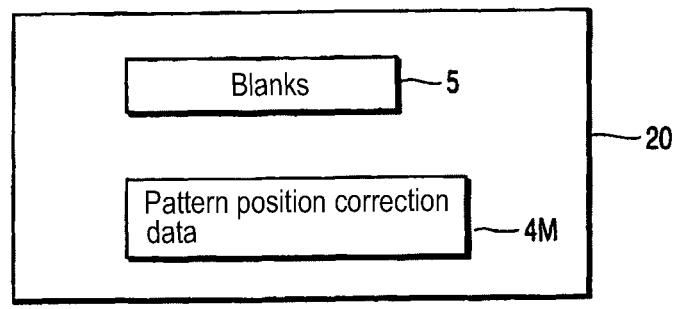
FIG. 10 is a diagram schematically showing a mask blanks product according to the seventh embodiment of the invention.

FIG. 10 is a diagram schematic showing a mask blanks product according to the seventh embodiment of the invention.

The mask blanks product 20 of the present embodiment comprises a mask blanks substrate 5, and a recording medium 4M having pattern position correction data recorded therein. The recording medium 4M is, for example, a wireless IC tag seal attached to a container accommodating the mask blanks substrate 5.

The mask blanks product 20 is manufactured and distributed by, for example, a mask blanks manufacturer. Native flatness data is prepared, for example, by a mask manufacturer having purchased the mask blanks product 20, or a mask blanks manufacturer. The mask blanks product 20 of the present embodiment includes the recording medium 4M, and therefore, the mask manufacturer having purchased the mask blanks product 20 does not have to generate pattern position correction data.

Eighth Embodiment

Figure 11:
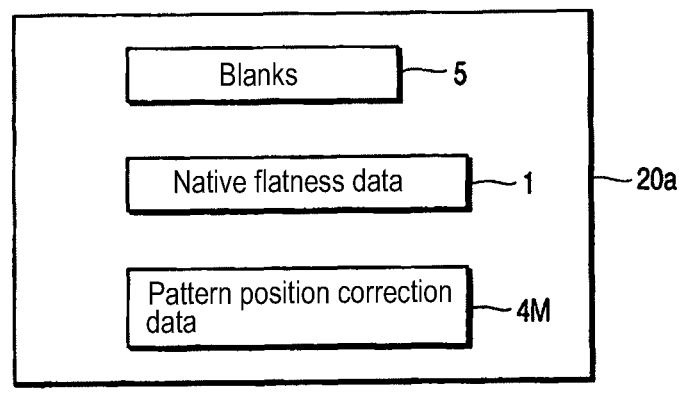
FIG. 11 is a diagram schematically showing a mask blanks product according to the eighth embodiment of the invention.

FIG. 11 is a diagram schematically showing a mask blanks product according to the eighth embodiment of the invention. Same parts as in FIG. 10 are identified with same reference numerals, and detailed description is omitted.

A mask blanks product 20*a* of the present embodiment comprises a mask blanks substrate 5, a recording medium 1M having native flatness data recorded therein, and a recording medium 4M having pattern position correction data recorded therein. The recording medium 1M and recording medium 4M may be either separate physically, or identical physically. In the latter case, the recording medium 1M, 4M is, for example, one wireless IC tag seal attached to a container accommodating the mask blanks substrate 5.

Since the mask blanks product 20*a* of the present embodiment includes the recording medium 4M, the mask manufacturer having purchased the mask blanks product 20*a* does not have to generate pattern position correction data.

Ninth Embodiment

Figure 12:
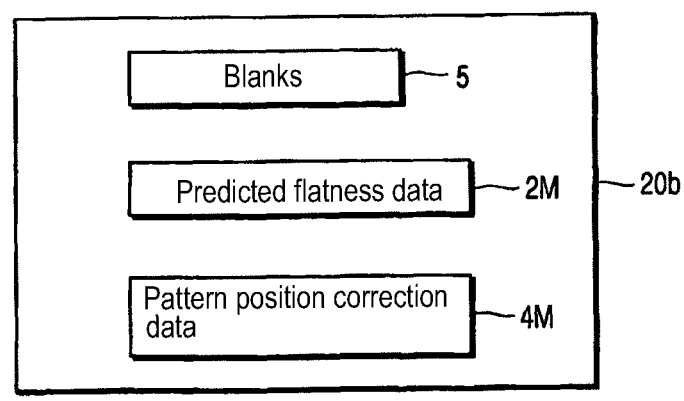
FIG. 12 is a diagram schematically showing a mask blanks product according to the ninth embodiment of the invention.

FIG. 12 is a diagram schematically showing a mask blanks product according to the ninth embodiment of the invention. Same parts as in FIG. 10 are identified with same reference numerals, and detailed description is omitted.

A mask blanks product 20b of the present embodiment comprises a mask blanks substrate 5, a recording medium 2M having predicted flatness data recorded therein, and a recording medium 4M having pattern position correction data recorded therein. The recording medium 2M and recording medium 4M may be either separate physically, or identical physically. In the latter case, the recording medium 2M, 4M is, for example, one wireless IC tag seal attached to a container accommodating the mask blanks substrate 5.

Since the mask blanks product 20b of the present embodiment includes the recording medium 4M, the mask manufacturer having purchased the mask blanks product 20b does not have to generate pattern position correction data.

Tenth Embodiment

FIG. 13 is a diagram schematically showing a mask blanks product according to the tenth embodiment of the invention. Same parts as in FIG. 10 are identified with same reference numerals, and detailed description is omitted.

A mask blanks product 20c of the present embodiment comprises a mask blanks substrate 5, a recording medium 1M having native flatness data recorded therein, a recording medium 2M having predicted flatness data recorded therein, and a recording medium 4M having pattern position correction data recorded therein. The recording medium 1M, recording medium 2M and recording medium 4M may be either separate physically, or identical at least in two of them physically. When all of them are identical physically, the recording medium 1M, 2M, 4M is, for example, one wireless IC tag seal attached to a container accommodating the mask blanks substrate 5.

The mask blanks product 20c of the present embodiment includes the recording medium 1M, 2M, 4M which may be required at the mask manufacturer, and the load of the mask manufacturer may be substantially lessened.

Eleventh Embodiment

FIG. 14 is a diagram schematically showing a mask blanks product according to the eleventh embodiment of the invention. Same parts as in FIG. 10 are identified with same reference numerals, and detailed description is omitted.

A mask blanks product 20d of the present embodiment comprises a mask blanks substrate 5, and a recording medium 6M having recorded therein predicted flatness variation data for predicting a flatness variation of an exposure mask cased when the exposure mask is chucked by a chuck unit of an exposure apparatus. The recording medium 6M is, for example, a wireless IC tag seal attached to a container accommodating the mask blanks, substrate 5.

The mask blanks product 20d is manufactured and distributed, for example, by a mask blanks manufacturer. Native flatness data is prepared by a mask manufacturer having purchased the mask blanks product 20d, or purchased from a mask blanks manufacturer.

Since the mask blanks product 20d of the present embodiment includes the recording medium 6M, the mask manufacturer having purchased the mask blanks product 20d does not have to generate predicted flatness variation data.

Twelfth Embodiment

FIG. 15 is a diagram schematically showing a mask blanks product according to the twelfth embodiment of the invention. Same parts as in FIG. 14 are identified with same reference numerals, and detailed description is omitted.

A mask blanks product 20e of the present embodiment comprises a mask blanks substrate 5, a recording medium 1M having native flatness data recorded therein, and a recording medium 6M having predicted flatness variation data recorded therein. The recording medium 1M and recording medium 6M may be either separate physically, or identical physically. In the latter case, the recording medium 1M, 6M is, for example, one wireless IC tag seal attached to a container accommodating the mask blanks substrate 5.

Since the mask blanks product 20e of the present embodiment includes the recording medium 6M, the manufacturer having purchased the mask blanks product 20e does not have to prepare predicted flatness variation data.

Thirteenth Embodiment

Figure 16:
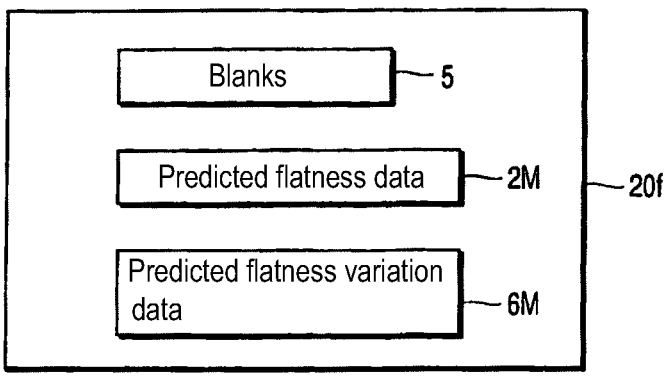
FIG. 16 is a diagram schematically showing a mask blanks product according to the thirteenth embodiment of the invention.

FIG. 16 is a diagram schematically showing a mask blanks product according to the thirteenth embodiment of the invention. Same parts as in FIG. 14 are identified with same reference numerals, and detailed description is omitted.

A mask blanks product 20f of the present embodiment comprises a mask blanks substrate 5, a recording medium 2M having predicted flatness data recorded therein, and a recording medium 6M having predicted flatness variation data recorded therein. The recording medium 2M and recording medium 6M may be either separate physically, or identical physically. In the latter case, the recording medium 2M, 6M is, for example, one wireless IC tag seal attached to a container accommodating the mask blanks substrate 5.

Since the mask blanks product 20f of the present embodiment includes the recording medium 6M, the mask manufacturer having purchased the mask blanks product 20f does not have to prepare predicted flatness variation data.

Fourteenth Embodiment

Figure 17:
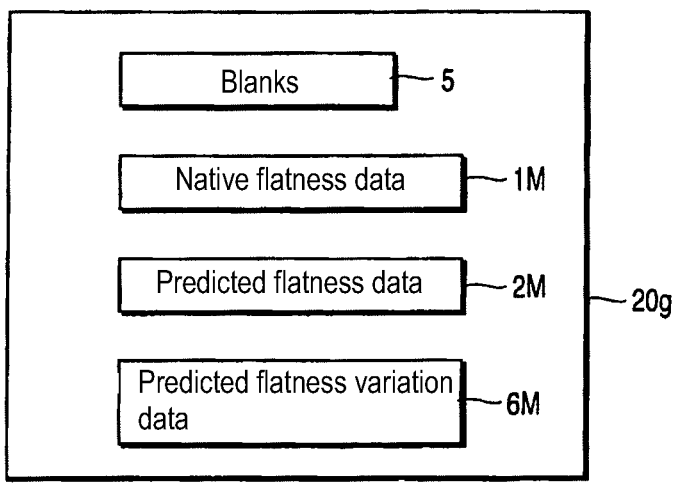
FIG. 17 is a diagram schematically showing a mask blanks product according to the fourteenth embodiment of the invention.

FIG. 17 is a diagram schematically showing a mask blanks product according to the fourteenth embodiment of the invention. Same parts as in FIGS. 15 and 16 are identified with same reference numerals, and detailed description is omitted.

A mask blanks product 20g of the present embodiment comprises a mask blanks substrate 5, a recording medium 1M having native flatness data recorded therein, a recording medium 2M having predicted flatness data recorded therein, and a recording medium 6M having predicted flatness variation data recorded therein. The recording medium 1M, recording medium 2M and recording medium 6M may be either separate physically, or identical at least in two of them physically. When all of them are identical physically, the recording medium 1M, 2M, 6M is, for example, one wireless IC tag seal attached to a container accommodating the mask blanks substrate 5.

The mask blanks product 20g of the present embodiment includes the recording medium 1M, 2M, 6M which may be required at the mask manufacturer, and therefore, the load of the mask manufacturer may be substantially lessened.

The present invention is not limited to these embodiments alone. For example, in the foregoing embodiments, the resist on the wafer is exposed with light by way of the photo mask, but the present invention may be also applied in the case in which a resist on a wafer is exposure with charged beam (for example, electron beam) by way of a charged beam mask (for example, an electron beam exposure mask).

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A mask blanks product comprising:
a mask blanks substrate to be processed into an exposure mask including a mask pattern; and
a non-transitory recording medium storing position correction data of a pattern to be drawn on the mask blanks substrate, the position correction data being data for bringing the mask pattern of the exposure mask into a predetermined position when the exposures mask is chucked by an exposure mask chuck unit of an exposure apparatus, wherein the position correction data is for correcting an effect of the chucking of the exposure mask.

2. The mask blanks product according to claim 1, wherein the non-transitory recording medium is a first non-transitory recording medium and wherein the mask blanks product further comprises a second non-transitory recording medium storing at least one of flatness of the mask blanks substrate in a state not chucked by the exposure mask chuck unit and predicted flatness of the mask blanks substrate in a state chucked by the exposure mask chuck unit.

3. The mask blanks product according to claim 1,
wherein the non-transitory recording medium includes a non-transitory wireless IC tag seal.

4. The mask blanks product according to claim 1, wherein the position correction data is for correcting for deformation of the exposure mask when the exposure mask is chucked by the exposure mask chuck unit.

5. The mask blanks product according to claim 1, wherein the non-transitory recording medium further stores at least one of flatness of the mask blanks substrate in a state not chucked by the exposure mask chuck unit and predicted flatness of the mask blanks substrate when chucked by the exposure mask chuck unit.

6. The mask blanks product according to claim 1, wherein the position correction data is based on a flatness of the mask blanks substrate in a state not chucked by the exposure mask chuck unit.

7. A mask blanks product comprising:
a mask blanks substrate to be processed into an exposure mask including a mask pattern; and
a non-transitory recording medium storing predicted flatness variation data, the predicted flatness variation data being data for predicting flatness variation of the exposure mask when the exposure mask is chucked by an exposure mask chuck unit of an exposure apparatus, wherein the flatness variation results from the chucking of the exposure mask.

8. The mask blanks product according to claim 7, wherein the non-transitory recording medium is a first non-transitory recording medium and wherein the mask blanks product further comprises a second non-transitory recording medium storing at least one of flatness of the mask blanks substrate in a state not chucked by the exposure mask chuck unit and predicted flatness of the mask blanks substrate in a state chucked by the exposure mask chuck unit.

9. The mask blanks product according to claim 7,
wherein the non-transitory recording medium includes a non-transitory wireless IC tag seal.

10. The mask blanks product according to claim 7, wherein the predicted flatness variation data is based on deformation of the exposure mask when the exposure mask is chucked by the exposure mask chuck unit.

11. The mask blanks product according to claim 7, wherein the non-transitory recording medium further stores at least one of flatness of the mask blanks substrate in a state not chucked by the exposure mask chuck unit and predicted flatness of the mask blanks substrate when chucked by the exposure mask chuck unit.

12. The mask blanks product according to claim 7, wherein the non-transitory recording medium further stores a predicted flatness of the exposure mask, wherein the predicted flatness of the exposure mask is based on the flatness variation of the exposure mask.

13. The mask blanks product according to claim 12, wherein the predicted flatness of the exposure mask is further based on a flatness of the mask blanks substrate in a state not chucked by the exposure mask chuck unit.

* * * * *